(12) United States Patent
Bae et al.

(10) Patent No.: US 10,443,162 B2
(45) Date of Patent: Oct. 15, 2019

(54) UNIDIRECTIONAL PREPREG AND PROCESSING METHOD THEREOF

(71) Applicant: Samsung Electronics Co., Ltd., Gyeonggi-do (KR)

(72) Inventors: Kwang-Jin Bae, Gyeongsangbuk-do (KR); Hee-Cheul Moon, Gyeonggi-do (KR); Byoung-Uk Yoon, Gyeonggi-do (KR); Bong-Suk Choi, Seoul (KR)

(73) Assignee: Samsung Electronics Co., Ltd (KR)

( * ) Notice: Subject to any disclaimer, the term of this patent is extended or adjusted under 35 U.S.C. 154(b) by 295 days.

(21) Appl. No.: 14/046,267

(22) Filed: Oct. 4, 2013

(65) Prior Publication Data

US 2014/0098475 A1    Apr. 10, 2014

(30) Foreign Application Priority Data

Oct. 5, 2012 (KR) .......... 10-2012-0110532

(51) Int. Cl.
| | |
|---|---|
| *D03D 25/00* | (2006.01) |
| *D04H 1/58* | (2012.01) |
| *H05K 7/02* | (2006.01) |
| *G06F 1/16* | (2006.01) |
| *D04H 3/04* | (2012.01) |

(Continued)

(52) U.S. Cl.
CPC .......... *D03D 25/00* (2013.01); *B29C 70/226* (2013.01); *D04H 1/58* (2013.01); *D04H 3/04* (2013.01); *D04H 3/115* (2013.01); *D04H 3/12* (2013.01); *G06F 1/1626* (2013.01); *H05K 7/02* (2013.01); *Y10T 428/249921* (2015.04); *Y10T 442/30* (2015.04); *Y10T 442/643* (2015.04)

(58) Field of Classification Search
CPC ............... B29C 70/00; B29C 70/226; Y10T 428/249921; Y10T 442/30; Y10T 442/643; D03D 25/00; D04H 1/58; D04H 3/115; D04H 3/12; G06F 1/1626; H05K 7/02
USPC ..................................... 428/292.1
See application file for complete search history.

(56) References Cited

U.S. PATENT DOCUMENTS

| | | | | |
|---|---|---|---|---|
| 6,808,796 B1* | 10/2004 | Miyao | ........... | B29C 70/202 428/113 |
| 2006/0110599 A1* | 5/2006 | Honma | ........... | B32B 5/10 428/413 |

(Continued)

FOREIGN PATENT DOCUMENTS

| | | |
|---|---|---|
| JP | 08-281645 | 10/1996 |
| KR | 10-0959389 | 5/2010 |
| KR | 10-0978142 | 8/2010 |

OTHER PUBLICATIONS

Korean Office Action dated Mar. 4, 2019 issued in counterpart application No. 10-2012-0110532, 30 pages.

*Primary Examiner* — Vincent Tatesure
(74) *Attorney, Agent, or Firm* — The Farrell Law Firm, P.C.

(57) ABSTRACT

A UniDirectional (UD) preimpregnated material (prepreg) and method of production are provided. A plurality of reinforced fibers are arranged in one direction. At least one auxiliary fiber is arranged such that it crosses the plurality of reinforced fibers to maintain the arrangement of the plurality of reinforced fibers. The plurality of reinforced fibers and the at least one auxiliary fiber are impregnated with a coupling material, and the coupling material is cured with the plurality of reinforced fibers and the at least one auxiliary fiber.

7 Claims, 7 Drawing Sheets

(51) Int. Cl.
*D04H 3/115* (2012.01)
*D04H 3/12* (2006.01)
*B29C 70/22* (2006.01)

(56) References Cited

U.S. PATENT DOCUMENTS

2010/0032049 A1* 2/2010 Wadahara .......... D03D 15/0094
                                                      139/435.1
2011/0293924 A1    12/2011 Liao

* cited by examiner

⇩ POST PROCESS

⇩ BOARD PROCESSING

⇩ FORMING

UNIDIRECTIONAL PREPREG AND PROCESSING METHOD THEREOF

PRIORITY

This application claims priority under 35 U.S.C. § 119(a) to a Korean patent application filed in the Korean Intellectual Property Office on Oct. 5, 2012 and assigned Ser. No. 10-2012-0110532, the entire disclosure of which is incorporated herein by reference.

BACKGROUND OF THE INVENTION

1. Field of the Invention

The present invention relates to a UniDirectional (UD) prepreg and a processing method thereof 2. Description of the Related Art A composite material is configured using two or more basic materials, and has a characteristic that cannot be obtained by one of the basic materials alone. Generally, a composite material is formed using at least one preimpregnated material (hereinafter, "prepreg"). A prepreg denotes a product that is in the form of a sheet in which a reinforced fiber is impregnated with a coupling material. A composite material having a characteristic desired by a designer can be manufactured using the prepreg. Types of reinforced fiber of a prepreg include, for example, carbon fiber, glass fiber, aramid fiber, etc. Types of coupling material of a prepreg may include, for example, an epoxy resin, a polyester resin, a thermoplastic resin, etc. A prepreg forms various product groups depending on the type of fiber used, the arrangement and configuration of the fiber, and the type of coupling material used.

A composite material that is produced using a prepreg can improve various characteristics such as, for example, strength, stiffness, corrosion resistance, fatigue, ware resistance, impact resistance, weight reduction, etc., compared to other materials.

A UD prepreg includes fibers aligned in one direction. Due to its resulting appearance, the UD prepreg is widely used as a composite material for forming an electronic device. A composite material, used in a housing of the electronic device, is manufactured in the form of a board plank by stacking and then attaching a plurality of basic materials under a UD prepreg. This composite material board is formed into a housing via forming methods such as, for example, compression forming using a mold, pressure vessel forming using an autoclave, etc. The housing exposes the UD prepreg. The UD prepreg of the composite material board may be post-processed before the housing is formed for appearance purposes. This post-process includes, for example, dyeing, deposition, etc.

However, it is undesirable to post-process a UD prepreg before forming a composite material. The fiber arrangement of the UD prepreg of the composite material is maintained during post-processing due to a fixing force between basic materials. However, when the UD prepreg is preferentially post-processed before the composite material is formed, the fiber arrangement of the UD prepreg is scattered due to shrinkage and expansion. Consequently, the post-process for the UD prepreg is only possible under limited circumstances.

SUMMARY OF THE INVENTION

The present invention has been made to address at least the above problems and/or disadvantages and to provide at least the advantages described below. Accordingly, an aspect of the present invention provides a UD prepreg that can overcome limited circumstances for post-processing and secure variety of post-processes, and a processing method thereof.

Another aspect of the present invention provides a UD prepreg that maintains fiber arrangement during a post— process, and a processing method thereof.

An additional aspect of the present invention provides a UD prepreg provides a desirable appearance for an electronic device, and a processing method thereof.

In accordance with an aspect of the present invention, a method is provided for processing a UD prepreg. A plurality of reinforced fibers are arranged in one direction. At least one auxiliary fiber is arranged such that it crosses the plurality of reinforced fibers to maintain the arrangement of the plurality of reinforced fibers. The plurality of reinforced fibers and the at least one auxiliary fiber are impregnated with a coupling material, and the coupling material is cured with the plurality of reinforced fibers and the at least one auxiliary fiber.

In accordance with another aspect of the present invention, a UD prepreg is provided that includes a plurality of reinforced fibers arranged in one direction. The UD prepreg also includes at least one auxiliary fiber that crosses the plurality of reinforced fibers to maintain an arrangement of the plurality of reinforced fibers. The UD prepreg further includes a coupling material that impregnating and cured with the plurality of reinforced fibers and the at least one auxiliary fiber.

In accordance with further another aspect of the present invention, an electronic device is provided. The electronic device includes a plurality of electronic components, and at least one housing that provides a space for receiving the electronic components. The at least one housing is formed from a UD prepreg having a plurality of reinforced fibers arranged in one direction, at least one auxiliary fiber that crosses the plurality of reinforced fibers to maintain an arrangement of the plurality of reinforced fibers, and a coupling material that impregnating and cured with the plurality of reinforced fibers and the at least one auxiliary fiber.

BRIEF DESCRIPTION OF THE DRAWINGS

The above and other aspects, features, and advantages of the present invention will be more apparent from the following detailed description when taken in conjunction with the accompanying drawings, in which.

DETAILED DESCRIPTION OF EMBODIMENTS OF THE PRESENT INVENTION

Figure 1A:
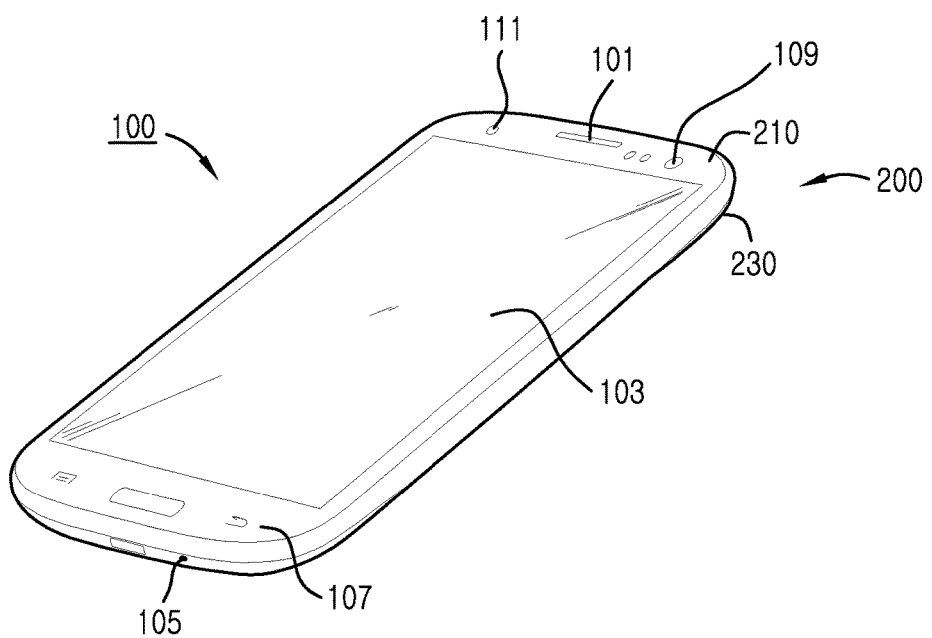
FIGS. 1A and 1B are diagrams illustrating perspective views of an electronic device, according to an embodiment of the present invention.

Embodiments of the present invention are described in detail with reference to the accompanying drawings. The same or similar components may be designated by the same or similar reference numerals although they are illustrated in different drawings. Detailed descriptions of constructions or processes known in the art may be omitted to avoid obscuring the subject matter of the present invention.

The terms and words used in the following description and claims are not limited to their dictionary meanings, but, are merely used to enable a clear and consistent understanding of the invention. Accordingly, it should be apparent to those skilled in the art that the following description of embodiments of the present invention are provided for illustration purpose only and not for the purpose of limiting the invention as defined by the appended claims and their equivalents.

Figure 1B:
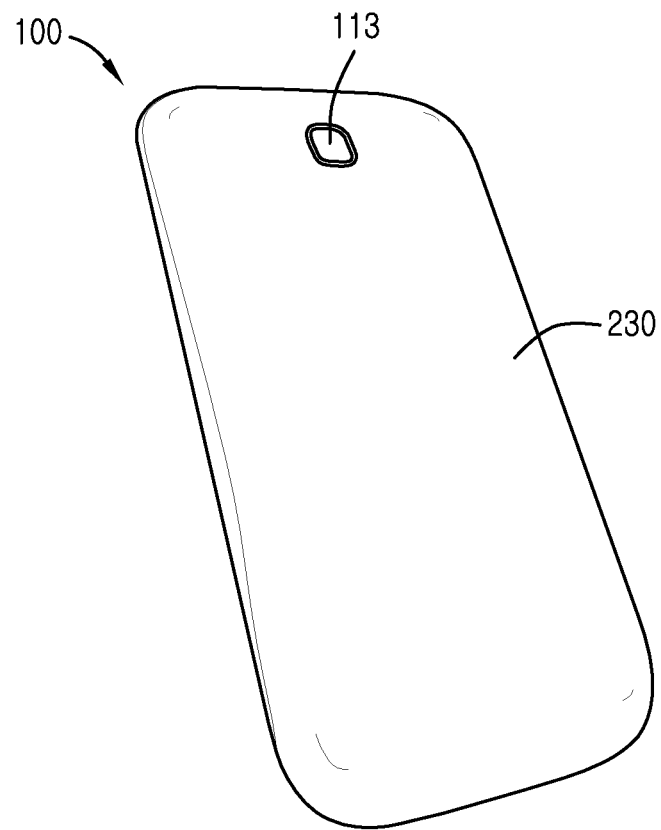
Figure 1C:
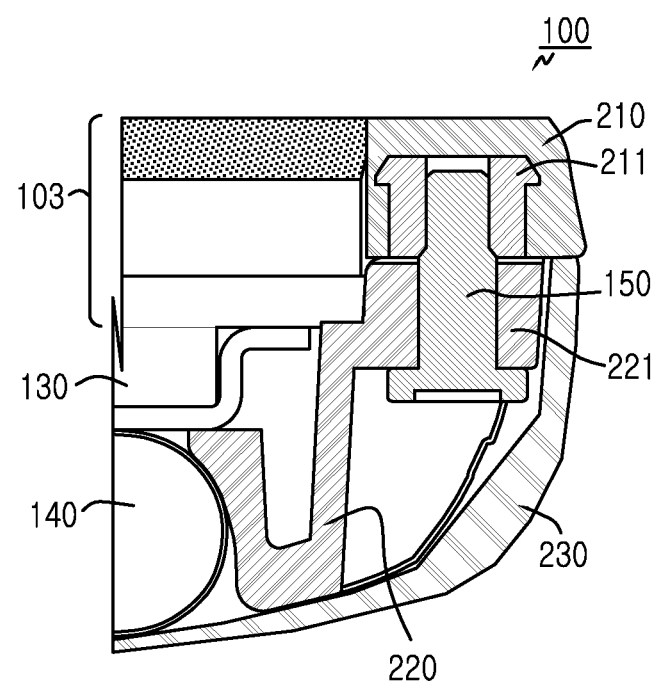
FIG. 1C is a diagram illustrating a cross-sectional view of a structure of an electronic device, according to an embodiment of the present invention.

FIGS. 1A and 1B are diagrams illustrating perspective views of an electronic device, according to an embodiment of the present invention. FIG. 1C is a diagram illustrating a cross-sectional view of the structure of an electronic device, according to an embodiment of the present invention.

Referring to FIGS. 1A to 1C, an electronic device 100 includes a speaker 101 for outputting sound, and a touchscreen 103, positioned below the speaker 101, for displaying an image and receiving a touch input. The electronic device 100 also includes a microphone 105, positioned below the touchscreen unit 103, for receiving sounds. The electronic device further includes a keypad 107, where input buttons are disposed, a front camera 109, and a rear camera 113.

The electronic device 100 has a housing 200 that provides an general appearance of the electronic device 100. The above-described elements of the electronic device 100 are received in a receiving space of the housing 200. The housing 200 includes a front housing 210, a rear housing 220, and a rear cover 230.

The front housing 210 and the rear housing 220 are coupled to each other, and form a space for receiving inner elements of the electronic device 100. The rear cover 230 covers the rear housing 220. The front housing 210 is disposed on the front side of the electronic device 100, and the rear cover 230 is disposed on the rear side of the electronic device 100. The rear cover includes a hole 2322 (FIG. 1D) that exposes the rear camera unit 113.

The front housing 210 and the rear housing 220 form a container that is open in a front direction of the electronic device 100. The touchscreen 103 is disposed on a mainboard 130 and includes a window and a display. The touchscreen 103 and the mainboard 130 are mounted in the space formed by the coupling of the front housing 210 and the rear housing 220. A battery 140 is received in a space formed by a coupling of the rear housing 220 and the rear cover 230.

The window of the touchscreen 103 is transparent and is exposed to the front side of the electronic device 100. An image is displayed via the window. The mainboard 130 denotes a substrate on which a basic circuit and a plurality of electronic parts are mounted. The mainboard 130 provides an execution environment of the electronic device 100, maintains information thereof, stably drives the electronic device 100, and enables swift data input/output exchange of all annexed units of the electronic device 100.

The front housing 210 forms a projection 211 for screw coupling with the rear housing 220. The projection 211 has a screw coupling portion having a screw hole for coupling with a screw. The screw coupling portion is metal and formed inside the projection 211 during injection molding. The rear housing 220 forms a projection coupling hole 221 for coupling with the projection 211 of the front housing 210. A screw 150 passes through the projection coupling hole 221 of the rear housing 220, couples with the projection 211 of the front housing 210, so that the front housing 210 and the rear housing 220 are coupled to each other.

Figure 1D:
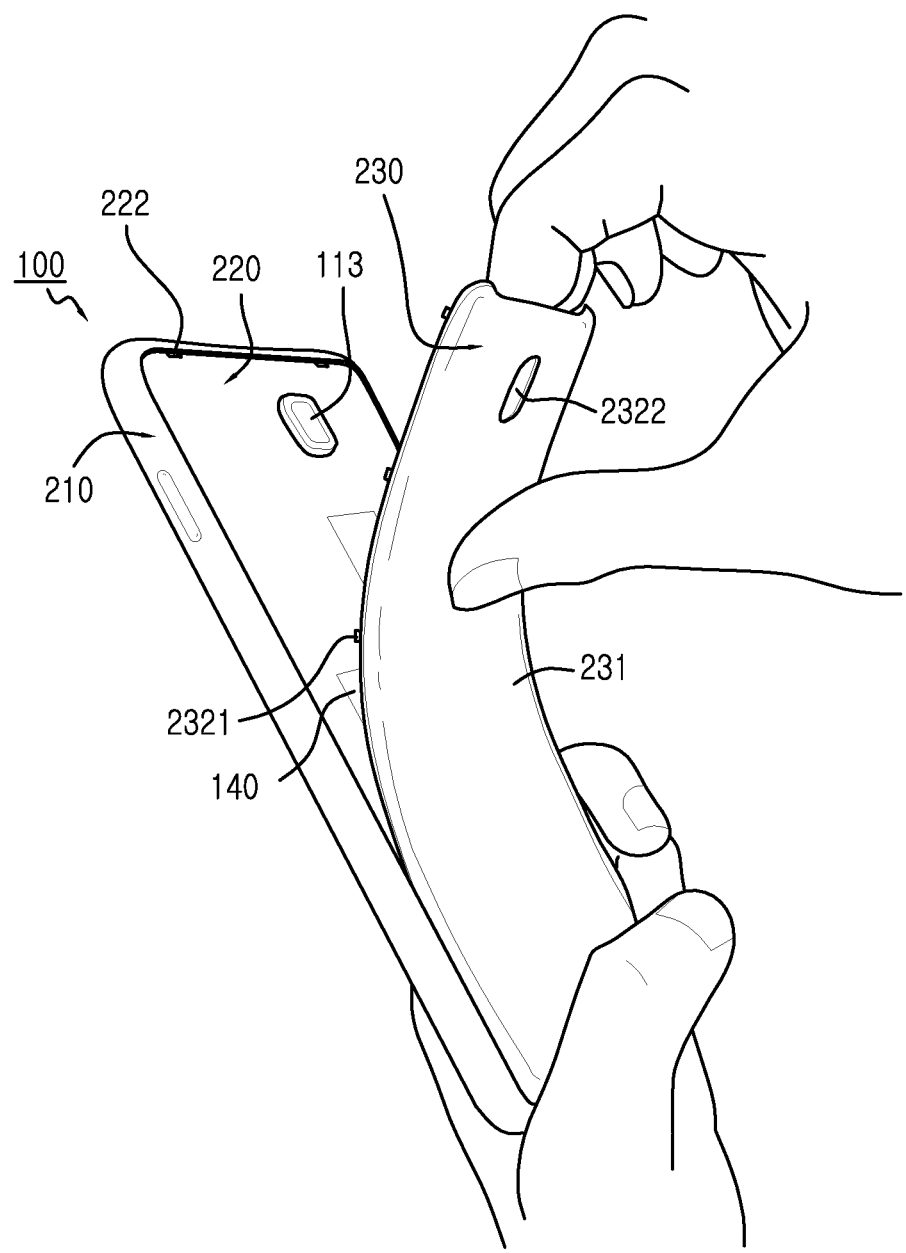
FIG. 1D is a diagram illustrating attachment/detachment of a rear cover of an electronic device, according to an embodiment of the present invention.

FIG. 1D is a diagram illustrating attachment/detachment of a rear cover of an electronic device, according to an embodiment of the present invention. The rear cover 230 may be coupled to the rear housing 220 or separated from the rear housing 220. The rear cover 230 includes one or more snap-fit projections 2321 disposed along its border, and the rear housing 220 includes one or more coupling recesses 222 corresponding to the one or more snap-fit projections 2321 at a relevant position of the border. When the rear housing 220 and the rear cover 230 couple to each other, the one or more snap-fit projections 2321 are coupled to the one or more coupling recesses 222. When the rear cover 230 is coupled to the rear housing 220 or separated from the rear housing 220, the rear cover 230 is elastically transformed, as illustrated.

A composite material using a UD prepreg can be applied to the front housing 210, the rear housing 220, and the rear cover 230. Particularly, the front housing 210 and the rear cover 230 are exposed and may be formed using a composite material having a desirable appearance.

Figure 2:
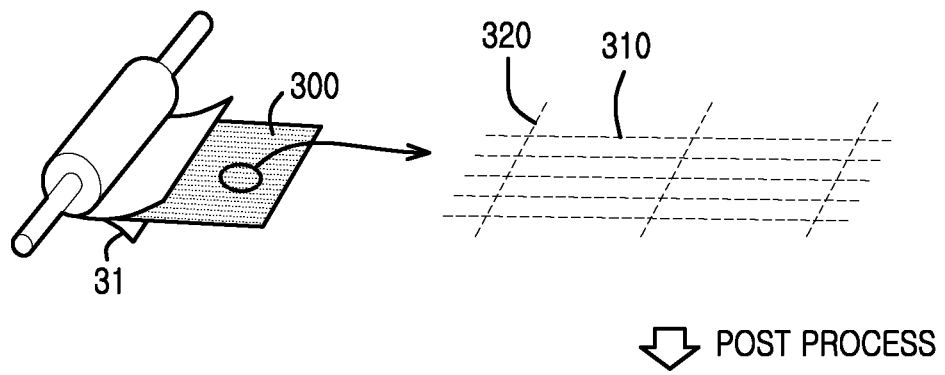
FIG. 2 is a diagram illustrating processing of a UD prepreg, according to an embodiment of the present invention.
Figure 2:
Figure 2:
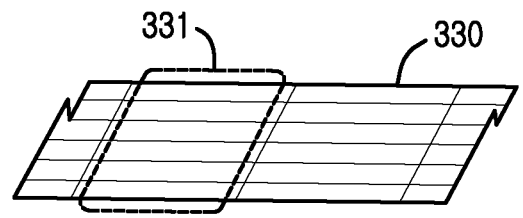
Figure 2:
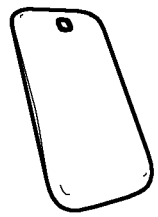

FIG. 2 is a diagram illustrating processing of a UD prepreg, according to an embodiment of the present invention.

Referring to FIG. 2, UD prepreg 300 is fit and wrapped between silicon paper protectors 31.

The UD prepreg 300 is formed as a sheet-type product by impregnating reinforced fiber 310 arranged in one direction and auxiliary fiber 320 fixed to the reinforced fiber 310, with a coupling material. The auxiliary fiber 320 has a fiber direction crossing a fiber direction of the reinforced fiber 310, and prevents scattering of the reinforced fiber 310. The reinforced fiber 310 includes at least one of carbon fiber, glass fiber, and aramid fiber. The coupling material includes at least one of an epoxy resin, a polyester resin, and a thermoplastic resin.

The auxiliary fiber 320 is fixed to the reinforced fiber 310 via a specific method, such as, for example, weaving, bonding, etc. The reinforced fiber 310 and the auxiliary fiber 320 may cross at a right angle or a predetermined angle that is not a right angle. The auxiliary fiber 320 includes at least one fiber and has strength that can fix the fiber arrangement of the reinforced fiber 310. The interval between the auxiliary fibers 320 may be from approximately 10 mm to approximately 200 mm, but is not limited thereto, and may be more than that when needed. The auxiliary fiber 320 may include a Kevlar® fiber having a high strength.

The UD prepreg 300 attains a more desirable appearance through a post-process such as, for example, dyeing, deposition, coating, etc. For example, since the UD prepreg 300 that has passed through the post-process has a fiber arrangement structure similar to the pattern of a hairline, it may have a perceptional depth to emphasize its appearance. Particularly, the fiber arrangement of the reinforced fiber 310 of the UD prepreg, according to an embodiment of the present invention, is not scattered, but maintained, because the auxiliary fiber 320 prevents the scattering of the fiber arrangement of the reinforced fiber 310.

A composite material board 300 is manufactured by stacking a plurality of basic materials and then attaching the same under the post-process-completed UD prepreg 300. Only a board 331 of the reinforced fiber 310 excluding the auxiliary fiber 320 is cut from the composite material board 300. The cut board 331 is formed as the housing of the electronic device 100 via a forming method such as, for example, compression forming using a mold, pressure vessel forming using an autoclave, etc.

Figure 3:
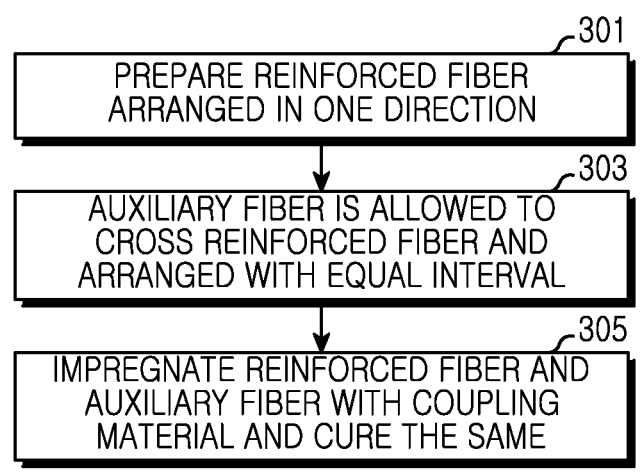
FIG. 3 is a flowchart illustrating a UD prepreg processing methodology, according to an embodiment of the present invention.

FIG. 3 is a flowchart illustrating a UD prepreg processing methodology, according to an embodiment of the present invention.

Referring to FIG. 3, reinforced fiber arranged in one direction is prepared, in step 301.

An auxiliary fiber is disposed to cross the reinforced fiber, and is arranged at equal intervals, in step 303. The auxiliary fiber is fixed to the reinforced fiber via a specific method such as, for example, weaving, bonding, etc. The reinforced fiber and the auxiliary fiber may cross each other at a right angle or a predetermined angle, which is not a right angle.

Respective auxiliary fibers may also be disposed at unequal intervals, according to another embodiment of the present invention. The respective auxiliary fibers may be parallel with each other, or may be disposed such that they are not parallel with each other.

The reinforced fiber and the auxiliary fiber are impregnated with a coupling material such as, for example, an epoxy resin, a polyester resin, a thermoplastic resin, etc., and then cured, in step 305. A post-process such as, for example, dyeing, deposition, etc., can be performed on a sheet of UD prepreg completed after curing. The post-processed UD prepreg can be formed as a composite material board.

The innermost portion of the housing of the electronic device, which is formed by the above-described UD prepreg, may be selectively cut from an opening between auxiliary fibers.

Figure 4:
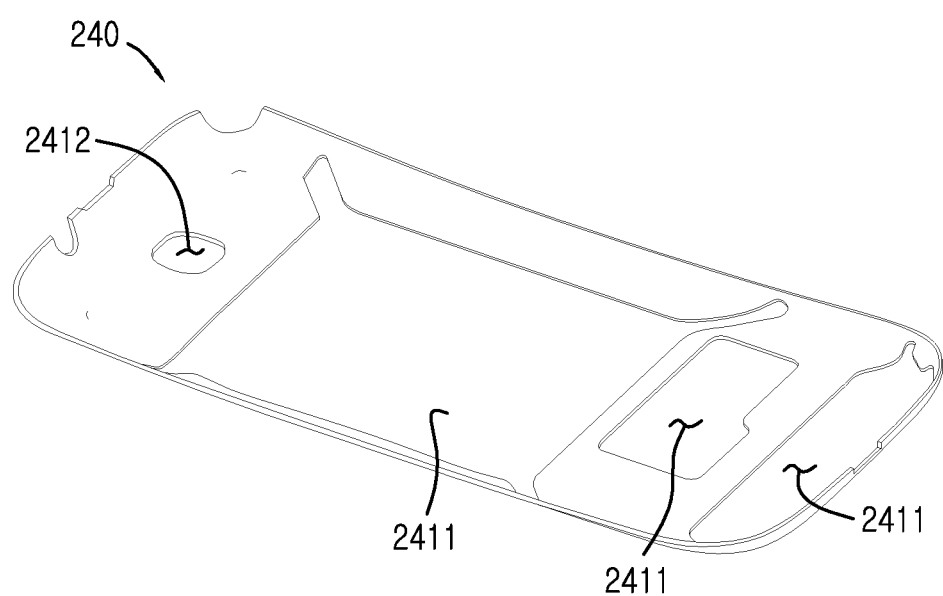
FIG. 4 illustrates a perspective view of a battery cover of an electronic device according to one or more embodiments.

FIG. 4 illustrates a perspective view of a battery cover of an electronic device according to one or more embodiments. Referring to FIG. 4, when the above-described reinforced fiber is applied to a battery cover 240 of a mobile terminal, which is an electronic device, the reinforced fiber may be cut such that a recess 2411 of a predetermined region is formed by a protrusion tolerance thereof, and may formed as an opening 1412 through which a camera lens assembly, an LED module, etc. may completely pass through and may be exposed.

While the invention has been shown and described with reference to certain embodiments thereof, it will be understood by those skilled in the art that various changes in form and detail may be made therein without departing from the spirit and scope of the invention as defined by the appended claims and their equivalents.

What is claimed is:

1. A preimpregnated material (prepreg) comprising:
a plurality of reinforced fibers arranged in one direction;
a plurality of auxiliary fibers that crosses and contacts the plurality of reinforced fibers to maintain an arrangement of the plurality of reinforced fibers;
a coupling material that couples the plurality of reinforced fibers and the plurality of auxiliary fibers within one layer, wherein the coupling material is cured after coupling the plurality of reinforced fibers and the plurality of auxiliary fibers;
a material laminated on the plurality of reinforced fibers, the plurality of auxiliary fibers, and the coupling material; and
a coating layer laminated on the material,
wherein an interval spacing between the plurality of auxiliary fibers is five times larger than an interval spacing between the plurality of reinforced fibers,
wherein strength of the auxiliary fibers is stronger than strength of the reinforced fibers,
wherein the plurality of reinforced fibers comprises one of carbon fibers, glass fibers, and aramid fibers,
wherein the plurality of auxiliary fibers comprises one of an aramid fiber and a basalt fiber, and
wherein the interval between the plurality of auxiliary fibers is greater than 25 mm and not more than 200 mm.

2. The prepreg of claim 1, wherein the plurality of auxiliary fibers is weaved into or bonded on the plurality of reinforced fibers.

3. The prepreg of claim 1, wherein the plurality of auxiliary fibers is disposed at a right angle to the plurality of reinforced fibers.

4. The prepreg of claim 1, wherein the coupling material comprises one of an epoxy resin, a polyester resin, and a thermoplastic resin.

5. The prepreg of claim 1, wherein the plurality of auxiliary fibers comprises a plurality of auxiliary fibers disposed at equal intervals.

6. The prepreg of claim 1, wherein the plurality of auxiliary fibers comprises a plurality of parallel auxiliary fibers.

7. An electronic device, comprising:
an electronic component; and
a housing providing inner space in which the electronic component is mounted,
wherein the housing is formed based on a UniDirectional (UD) preimpregnated material (prepreg) comprising a plurality of reinforced fibers arranged in a first direction and a plurality of auxiliary fibers that crosses and contacts the plurality of reinforced fibers to maintain an arrangement of the plurality of reinforced fibers in a second direction within one layer, wherein the interval between the plurality of auxiliary fibers is greater than 25 mm and not more than 200 mm.

* * * * *